(12) United States Patent
Lin

(10) Patent No.: US 10,074,553 B2
(45) Date of Patent: Sep. 11, 2018

(54) WAFER LEVEL PACKAGE INTEGRATION AND METHOD

(75) Inventor: Yaojian Lin, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 1188 days.

(21) Appl. No.: 11/949,282

(22) Filed: Dec. 3, 2007

(65) Prior Publication Data

US 2009/0140442 A1 Jun. 4, 2009

(51) Int. Cl.
*H01L 21/683* (2006.01)
*H01L 25/065* (2006.01)
(Continued)

(52) U.S. Cl.
CPC ........ *H01L 21/6835* (2013.01); *H01L 21/565* (2013.01); *H01L 21/568* (2013.01); *H01L 23/3135* (2013.01); *H01L 23/5389* (2013.01); *H01L 25/0652* (2013.01); *H01L 25/0655* (2013.01); *H01L 25/0657* (2013.01); *H01L 25/50* (2013.01); *H01L 23/3128* (2013.01); *H01L 23/49816* (2013.01);
(Continued)

(58) Field of Classification Search
CPC . H01L 21/565; H01L 21/568; H01L 21/6835; H01L 25/0655; H01L 25/0657; H01L 25/50; H01L 23/3135; H01L 23/5389; H01L 21/563; H01L 23/3128; H01L 24/17; H01L 24/81
USPC .......... 257/E23.02, 778, 723, 698, 701, 703, 257/724; 438/108, 613
See application file for complete search history.

(56) References Cited

U.S. PATENT DOCUMENTS 5,239,448 A * 8/1993 Perkins et al. ................ 361/764
5,250,843 A 10/1993 Eichelberger
(Continued)

FOREIGN PATENT DOCUMENTS

| KR | 20030075814 A | 9/2003 |
|---|---|---|
| TW | 200527625 A | 8/2005 |
| WO | 2005/008724 A2 | 1/2005 |

OTHER PUBLICATIONS

Hazeyama, I., "Micro-Bump Formation Technology for Flip-Chip LSIs Using Micro-Solder-Ball", NEC Research & Development, pp. 219-224, vol. 44, No. 8, Jul. 2003.

*Primary Examiner* — Mohsen Ahmadi
(74) *Attorney, Agent, or Firm* — Robert D. Atkins; Atkins and Associates P.C.

(57) ABSTRACT

In a wafer level chip scale package, a wafer level interconnect structure is formed on a dummy substrate with temperatures in excess of 200° C. First semiconductor die are mounted on the wafer level interconnect structure. The wafer level interconnect structure provides a complete electrical interconnect between the semiconductor die and one or more of the solder bumps according to the function of the semiconductor device. A second semiconductor die can be mounted to the first semiconductor die. A first encapsulant is formed over the semiconductor die. A second encapsulant is formed over the first encapsulant. The dummy substrate is removed. A first UBM is formed in electrical contact with the first conductive layer. Solder bumps are made in electrical contact with the first UBM. A second UBM is formed to electrically connect the semiconductor die to the wafer level interconnect structure.

6 Claims, 5 Drawing Sheets

(51) Int. Cl.
  *H01L 23/31* (2006.01)
  *H01L 21/56* (2006.01)
  *H01L 25/00* (2006.01)
  *H01L 23/538* (2006.01)
  *H01L 23/00* (2006.01)
  *H01L 23/498* (2006.01)

(52) U.S. Cl.
  CPC ........ *H01L 23/49822* (2013.01); *H01L 24/16* (2013.01); *H01L 24/48* (2013.01); *H01L 24/81* (2013.01); *H01L 2221/68345* (2013.01); *H01L 2224/05571* (2013.01); *H01L 2224/05573* (2013.01); *H01L 2224/16145* (2013.01); *H01L 2224/16225* (2013.01); *H01L 2224/48091* (2013.01); *H01L 2224/48227* (2013.01); *H01L 2224/48228* (2013.01); *H01L 2224/48472* (2013.01); *H01L 2224/812* (2013.01); *H01L 2224/81005* (2013.01); *H01L 2224/81801* (2013.01); *H01L 2225/0651* (2013.01); *H01L 2225/06513* (2013.01); *H01L 2225/06517* (2013.01); *H01L 2225/06527* (2013.01); *H01L 2225/06582* (2013.01); *H01L 2924/00014* (2013.01); *H01L 2924/01078* (2013.01); *H01L 2924/01079* (2013.01); *H01L 2924/04941* (2013.01); *H01L 2924/10253* (2013.01); *H01L 2924/14* (2013.01); *H01L 2924/1532* (2013.01); *H01L 2924/15192* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19107* (2013.01); *H01L 2924/30105* (2013.01)

(56) References Cited

U.S. PATENT DOCUMENTS

| | | | |
|---|---|---|---|
| 5,321,210 A * | 6/1994 | Kimbara et al. | 174/256 |
| 5,353,498 A | 10/1994 | Fillion et al. | |
| 5,710,071 A | 1/1998 | Beddingfield et al. | |
| 5,841,193 A | 11/1998 | Eichelberger | |
| 5,998,243 A | 12/1999 | Odashima et al. | |
| 6,046,077 A * | 4/2000 | Baba | 438/127 |
| 6,075,290 A | 6/2000 | Schaefer et al. | |
| 6,291,331 B1 * | 9/2001 | Wang et al. | 438/618 |
| 6,312,830 B1 * | 11/2001 | Li et al. | 428/624 |
| 6,319,846 B1 | 11/2001 | Lin et al. | |
| 6,396,153 B2 | 5/2002 | Fillion et al. | |
| 6,418,615 B1 * | 7/2002 | Rokugawa et al. | 29/852 |
| 6,459,159 B1 | 10/2002 | Miyagawa et al. | |
| 6,518,089 B2 | 2/2003 | Coyle | |
| 6,662,442 B1 * | 12/2003 | Matsui et al. | 29/852 |
| 6,838,776 B2 | 1/2005 | Leal et al. | |
| 6,919,226 B2 | 7/2005 | Ogawa et al. | |
| 6,921,975 B2 | 7/2005 | Leal et al. | |
| 7,019,404 B2 * | 3/2006 | Rokugawa et al. | 257/778 |
| 7,041,590 B2 | 5/2006 | Tseng et al. | |
| 7,125,745 B2 * | 10/2006 | Chen et al. | 438/108 |
| 7,268,012 B2 | 9/2007 | Jiang et al. | |
| 7,351,784 B2 | 4/2008 | Lehman, Jr. | |
| 7,619,901 B2 | 11/2009 | Eichelberger et al. | |
| 2002/0068453 A1 | 6/2002 | Grigg et al. | |
| 2003/0054184 A1 | 3/2003 | Miyadera et al. | |
| 2003/0160325 A1 * | 8/2003 | Yoneda | H01L 21/4846 257/758 |
| 2003/0183917 A1 * | 10/2003 | Tsai | H01L 23/3128 257/686 |
| 2003/0188975 A1 | 10/2003 | Nielsen | |
| 2003/0193088 A1 | 10/2003 | Hall et al. | |
| 2004/0040152 A1 * | 3/2004 | Kigami et al. | 29/890.1 |
| 2004/0056344 A1 * | 3/2004 | Ogawa et al. | 257/686 |
| 2004/0124513 A1 * | 7/2004 | Ho | H01L 23/147 257/678 |
| 2005/0006752 A1 * | 1/2005 | Ogawa | 257/700 |
| 2005/0136761 A1 | 6/2005 | Murakami et al. | |
| 2005/0194674 A1 * | 9/2005 | Thomas et al. | 257/690 |
| 2005/0212133 A1 | 9/2005 | Barnak et al. | |
| 2005/0224966 A1 | 10/2005 | Fogel et al. | |
| 2005/0287706 A1 * | 12/2005 | Fuller | H01L 21/563 438/108 |
| 2006/0103029 A1 | 5/2006 | Basheer et al. | |
| 2006/0121719 A1 * | 6/2006 | Nakamura | H01L 21/4857 438/613 |
| 2006/0134831 A1 * | 6/2006 | Cohen | G01R 3/00 438/108 |
| 2006/0272854 A1 | 10/2006 | Yamano | |
| 2006/0255438 A1 | 11/2006 | Omori et al. | |
| 2006/0255473 A1 | 11/2006 | Pendse | |
| 2007/0001293 A1 | 1/2007 | Jiang et al. | |
| 2007/0076348 A1 | 4/2007 | Shioga et al. | |
| 2007/0184578 A1 * | 8/2007 | Lin | H05K 3/3452 438/106 |
| 2007/0235878 A1 * | 10/2007 | Lin | H01L 23/525 257/773 |
| 2009/0008765 A1 * | 1/2009 | Yamano | H01L 21/565 257/690 |
| 2009/0046441 A1 | 2/2009 | Funaya et al. | |

* cited by examiner

WAFER LEVEL PACKAGE INTEGRATION AND METHOD

FIELD OF THE INVENTION

The present invention relates in general to semiconductor devices and, more particularly, to wafer level package integration.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to achieve wafer level package integration with one or more semiconductor devices. The interconnect between the semiconductor die has been achieved with through hole conductive vias and redistribution layers (RDL). However, the formation of the interconnect structure, including RDLs, is typically performed on an organic substrate having a low glass transition temperature (Tg). The substrate Tg is typically less than 200° C., which limits processing options for the interconnect structure. In addition, the inter-wafer and intra-wafer registration variation of the semiconductor wafer is relatively large, which reduces manufacturability and wafer integration.

SUMMARY OF THE INVENTION

In one embodiment, the present invention is a method of making a wafer level chip scale package comprising the steps of providing a substrate, and forming a wafer level interconnect structure by forming a first passivation layer on the substrate, forming a first conductive layer over the first passivation layer, forming a second passivation layer over the first conductive layer and first passivation layer, forming a second conductive layer over the second passivation layer, forming a third passivation layer over the second conductive layer, forming a third conductive layer in electrical contact with the second conductive layer, and forming a fourth passivation layer over the third conductive layer and third passivation layer. The method further includes the steps of mounting a plurality of first semiconductor die on the wafer level interconnect structure in electrical contact with the third conductive layer, depositing a first encapsulant over the plurality of first semiconductor die, removing the substrate, forming a first under bump metallization (UBM) in electrical contact with the first conductive layer, and forming a plurality of solder bumps on the first UBM.

In another embodiment, the present invention is a method of making a wafer level chip scale package comprising the steps of providing a substrate, and forming a wafer level interconnect structure by forming a first conductive layer on the substrate, forming a second conductive layer in electrical contact with the first conductive layer, and forming a third conductive layer in electrical contact with the second conductive layer. The method further includes the steps of mounting a plurality of first semiconductor die over the wafer level interconnect structure in electrical contact with the third conductive layer, depositing a first encapsulant over the plurality of first semiconductor die, removing the substrate, and forming a backside interconnect in electrical contact with the first conductive layer.

In another embodiment, the present invention is a method of making a wafer level chip scale package comprising the steps of providing a substrate, forming a wafer level interconnect structure over the substrate with temperatures in excess of 200° C., mounting a plurality of first semiconductor die in electrical contact with the wafer level interconnect structure, depositing a first encapsulant over the plurality of first semiconductor die, and removing the substrate.

In another embodiment, the present invention is a semiconductor device comprising a wafer level interconnect structure formed with a temperature in excess of 200° C. A plurality of first semiconductor die is mounted to and in electrical contact with the wafer level interconnect structure. An encapsulant is deposited over the plurality of first semiconductor die.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
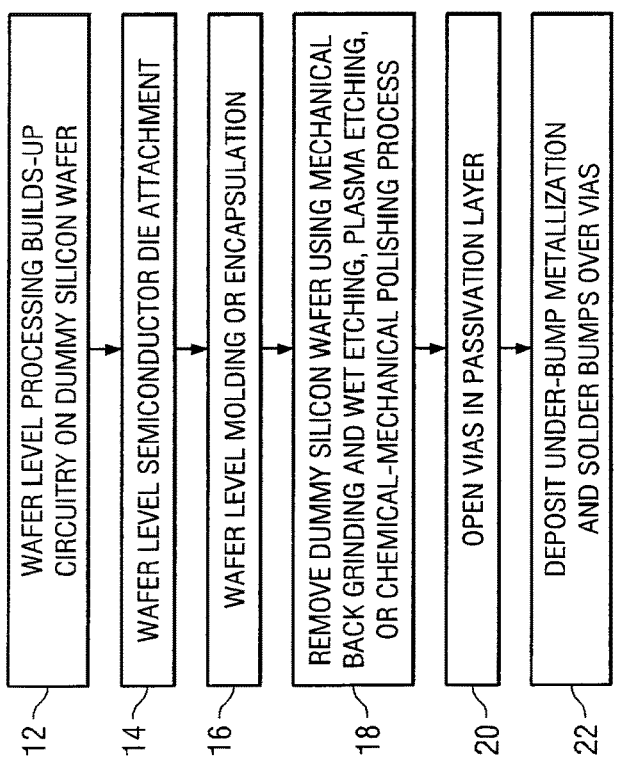
FIG. 1 illustrates a process of manufacturing a wafer level chip scale package.

FIG. 1 illustrates a process of manufacturing a wafer level chip scale package. In a first step 12, a wafer level process is used to form circuitry over a dummy silicon wafer. Wafer level processing may include any semiconductor device fabrication processes such as wafer level redistribution, material deposition and removal processes, patterning for removing material from the wafer, and doping for changing the electrical characteristics of the wafer. During wafer level processing, single or multiple layers of material may be deposited and patterned on the dummy silicon wafer. In step 14, semiconductor die are connected to contact pads formed upon the wafer using a bonding or flip-chip connection process. In step 16, an encapsulant or molding compound is deposited over the wafer and attached semiconductor die. The molding or encapsulation compound may include any suitable material as described below. In step 18, the dummy silicon wafer is removed using mechanical back grinding and wet etching, plasma etching, or chemical-mechanical polishing. After the dummy silicon wafer is removed, optional step 20 opens vias in one or more passivation layers that were deposited during wafer level processing. The vias may be opened using a lithography and/or etching process. In optional step 22, under bump metallization (UBM) and solder bumps are deposited over the vias formed in step 20.

Figure 2A:
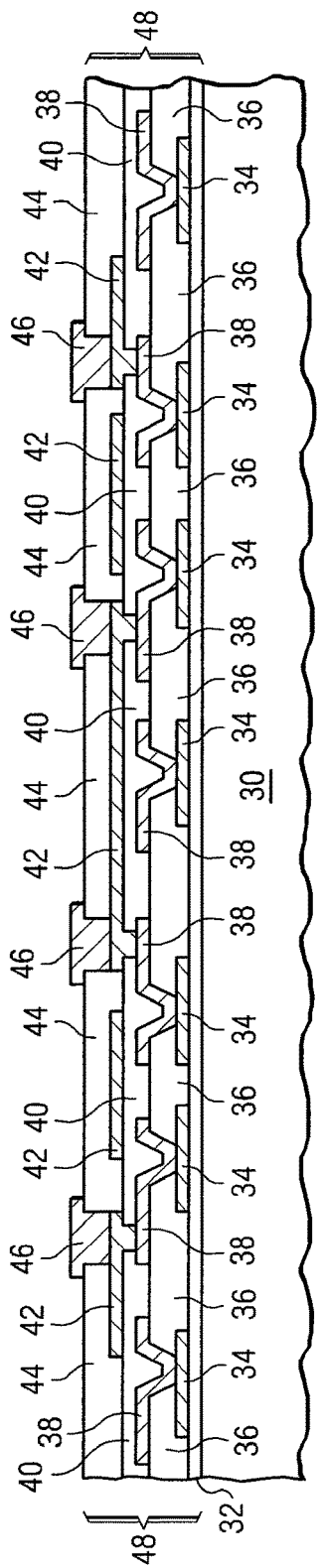
FIGS. 2a-2c illustrate formation of an interconnect structure for semiconductor die using RDL.
Figure 2B:
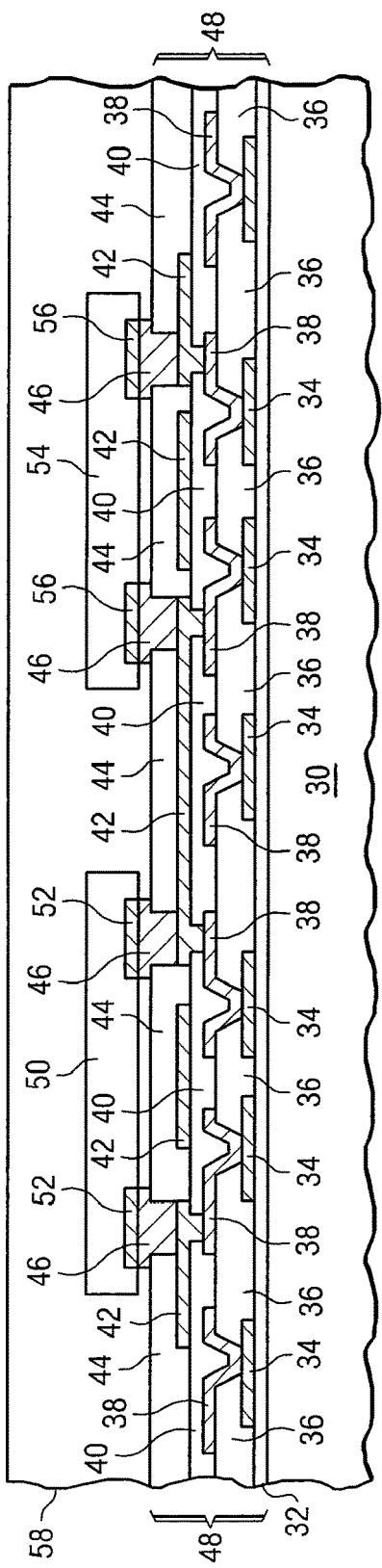
Figure 2C:
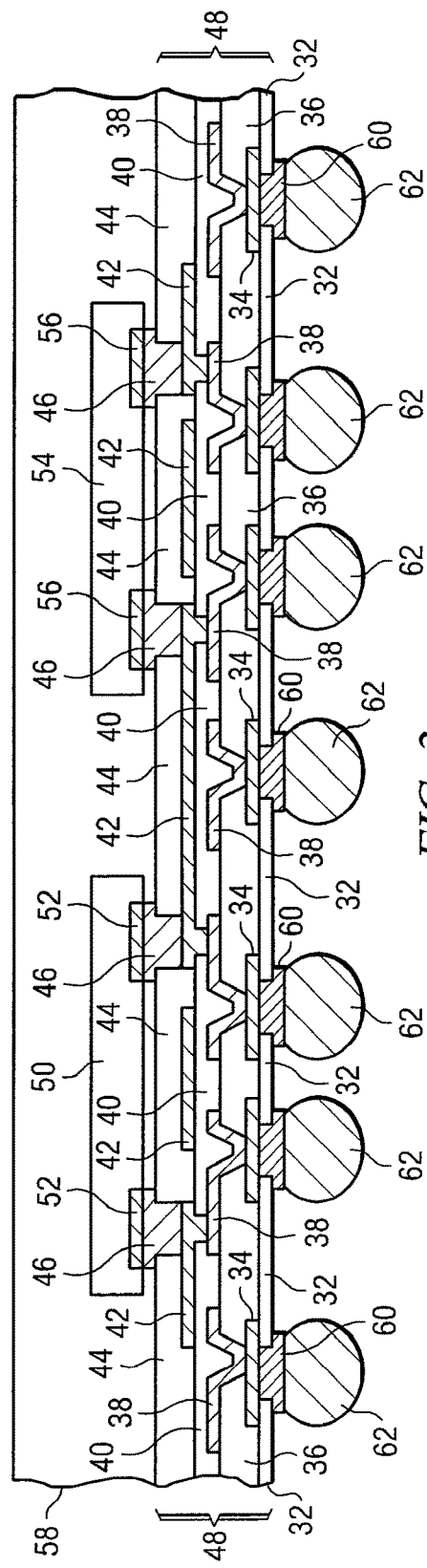

FIGS. 2a-2c illustrate a wafer level interconnect structure for use with WLCSP or other semiconductor devices. In FIG. 2a, a low cost dummy substrate 30 is provided which is made with silicon, glass, composite material with proper coefficient of thermal expansion (CTE), or other materials capable of supporting processing temperatures in excess of 200° C. Substrate 30 is a temporary and sacrificial supporting wafer substrate.

A passivation layer 32 is formed over substrate 30. Passivation layer 32 is chosen to have good selectivity as a silicon etchant so it can act as an etch stop during later removal of the dummy substrate. Passivation layer 32 can have single or multiple layers of silicon nitride (Si3N4), silicon dioxide (SiO2), silicon oxynitride (SiON), SiO2/Si3N4, or other material having dielectric properties. Passivation layer 32 can be a metal layer, such as copper (Cu).

An electrically conductive layer 34 is formed as a contact pad using a patterning and deposition process. Conductive layer 34 can be made with aluminum (Al), Cu, tin (Sn), nickel (Ni), gold (Au), silver (Ag), or other electrically conductive material. The deposition of conductive layer 34 uses an electrolytic plating or electroless plating process.

A passivation layer 36 is formed over passivation layer 32 and conductive layer 34 for structural support and electrical isolation. Passivation layer 36 can have one or more layers of Si3N4, SiO2, SiON, polyimide (PI), benzocyclobutene (BCB), polybenzoxazole (PBO), WPR, epoxy, or other insulating material. A portion of passivation layer 36 is removed using a mask-defined etching process to expose conductive layer 34.

An electrically conductive layer 38 is deposited over and follows the contour of passivation layer 36. The conductive layer 38 electrically connects to conductive layer 34. Conductive layer 38 can be made with Al, Ni, nickel vanadium (NiV), Cu, or Cu alloy. Conductive layer 38 can be made by an electrolytic plating or electroless plating process. Conductive layer 38 can be made with a single layer, or multiple layers using an adhesion layer of titanium (Ti), titanium tungsten (TiW), or chromium (Cr).

A passivation layer 40 is formed over passivation layer 36 and conductive layer 38 for structural support and electrical isolation. Passivation layer 40 can have one or more layers of Si3N4, SiO2, SiON, PI, BCB, PBO, WPR, epoxy, or other insulating material. A portion of passivation layer 40 is removed using a mask-defined etching process to expose conductive layer 38.

An electrically conductive layer 42 is formed over passivation layer 40 in electrical contact with conductive layer 38. Conductive layer 42 can be made with Al, Cu, Sn, Ni, Au, Ag, or other electrically conductive material. The deposition of conductive layer 42 uses an electrolytic plating or electroless plating process.

A passivation layer 44 is formed over passivation layer 40 and conductive layer 42 for structural support and electrical isolation. Passivation layer 44 can have one or more layers of Si3N4, SiO2, SiON, PI, BCB, PBO, WPR, epoxy, or other insulating material. A portion of passivation layer 44 is removed using a mask-defined etching process to expose conductive layer 42. Passivation layer 44 is optional.

A metal layer 46 is deposited over passivation layer 44 and conductive layer 42 by an evaporation, electrolytic plating, electroless plating, or screen printing process. Metal layer 46 is an UBM layer. UBM 46 can be made with Ti, Ni, NiV, Cu, or Cu alloy.

The combination of passivation layer 32, conductive layer 34, passivation layer 36, conductive layer 38, passivation layer 40, conductive layer 42, and passivation layer 44 constitute a wafer level redistribution layer (WL RDL) or interconnect structure 48. WL RDL 48 is implemented through an interconnect circuit build-up process, as described in FIG. 2a, to provide electrical connection between semiconductor die 50 and 54, as well as electrical connection to solder bumps 62, as described hereinafter.

In FIG. 2b, semiconductor die 50 has contact pads 52 formed on its active surface. Contact pads 52 are electrically connected to UBMs 46 by thermal bonding or flip-chip interconnect. Likewise, semiconductor die 54 has contact pads 56 formed on its active surface. Contact pads 56 are electrically connected to UBMs 46 by thermal bonding or flip-chip interconnect. Semiconductor die 50 and 54 represent various IC dies and discrete components that can be mounted on top surface of WL RDL 48 and connected to conductive layers of the interconnect structure and/or UBMs 46. Semiconductor die 50 and 54 each include active and passive devices, conductive layers, and dielectric layers on the active surface according to the electrical design of the die. The discrete components can be filters, discrete passive devices, such as inductors, resistors, or capacitors, or other discrete devices.

An encapsulant or molding compound 58 is formed on the top surface of the WL RDL interconnect structure 48 over semiconductor die 50 and 54. Encapsulant 58 can be made with epoxy or polymer material, and can be solid or liquid as incoming material in the process. The backside of semiconductor die 50 and 54 can be exposed in the molding process.

In FIG. 2c, the dummy substrate 30 is removed by mechanical backgrinding, chemical wet etching, plasma dry etching, or chemical mechanical polishing. Passivation layer 32 is patterned and etched to expose conductive layer 34. Alternatively, passivation layer 32 can be patterned and etched before conductive layer 34 is formed on substrate 30. A metal layer 60 is deposited over passivation layer 32 by an evaporation, electrolytic plating, electroless plating, or screen printing process. Metal layer 60 can be made with Ti, Ni, NiV, Cu, or Cu alloy. Metal layer 60 is a UBM in electrical contact with conductive layer 34. UBMs 60 can be a multiple metal stack with adhesion layer, barrier layer, and wetting layer. The adhesion layer is made with Ti, Cr, Al, TiW, or titanium nitride (TiN). The barrier layer can be made with Ni, NiV, CrCu, or TiW. The wetting layer can be made with Cu, Au, or Ag. UBMs 60 can be electroless Ni or Au on conductive layer 34 for both solder bumps and wire bonding.

After removing supporting wafer substrate 30 by backgrinding or etching, an electrically conductive solder material is deposited over UBMs 60 using an electrolytic plating or electroless plating process. The solder material can be any metal or electrically conductive material, e.g., Sn, lead (Pb), Ni, Au, Ag, Cu, bismuthinite (Bi) and alloys thereof. In one embodiment, the solder material is 63 percent weight of Sn and 37 percent weight of Pb. The solder material is reflowed by heating the conductive material above its melting point to form spherical balls or bumps 62. In some applications, solder bumps 62 are reflowed a second time to improve electrical contact to the UBM structure.

WL RDL 48 is a single or multiple layer wafer level interconnect structure. The multiple layers may include one or more conductive layers and insulation layers, such as flip-on-chip (FOC), BCB redistribution layers (RDL), PI RDL, and PI/BCB repassivation. The processing temperature used in forming WL RDL 48 is typically greater than 200° C., but can be lower. WL RDL 48 provides a complete wafer level interconnect for semiconductor die 50 and 54 according to its functional design. The electrical signals from semiconductor die 50 and 54 are routed through the WL RDL interconnect structure 48 to one or more of the solder bumps 62 according to the function of the semiconductor device. Solder bumps 62 are optional.

As described in FIGS. 2a-2c, WL RDL 48 is formed on dummy substrate 30 prior to mounting semiconductor die 50 and 54. Once the semiconductor die are mounted and encapsulated, the dummy substrate is removed so external interconnects such as UBMs 60 and solder bumps 62 can be formed. By forming WL RDL 48 on a dummy substrate prior to mounting the semiconductor die, the processing temperature restriction due to the WL RDL process noted in the background can be reduced. In other words, since there is no substrate with Tg less than 200° C. used in the process, higher temperatures in excess of 200° C. can be used to form WL RDL 48. In addition, inter-wafer and intra-wafer registration variation of semiconductor die can be reduced by mounting the die to the patterned dummy substrate. The process improves manufacturability, flexibility, wafer integration, and self-alignment effect of the WLSCP.

Figure 3:
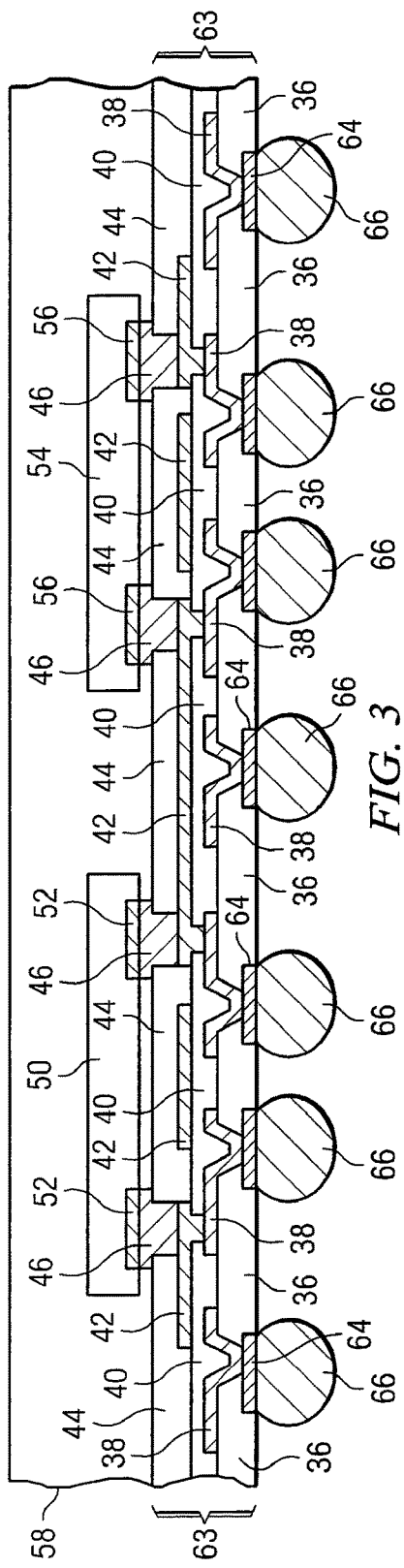
FIG. 3 illustrates an alternate embodiment of the interconnect structure for the semiconductor die.

FIG. 3 is a cross-sectional view of another embodiment of the wafer level interconnect structure. As described in FIGS. 2a-2c, a low cost dummy substrate 30 is provided. Substrate 30 is a temporary and sacrificial supporting wafer substrate. A passivation layer 36 is formed over substrate 30 for structural support and electrical isolation. Passivation 32 and conductive layer 34 are not used in this embodiment. A portion of passivation layer 36 is removed using a mask-defined etching process. An electrically conductive layer 38 is deposited over and follows the contour of passivation layer 36. A passivation layer 40 is formed over passivation layer 36 and conductive layer 38 for structural support and electrical isolation. A portion of passivation layer 40 is removed using a mask-defined etching process to expose conductive layer 38. An electrically conductive layer 42 is formed over passivation layer 40 in electrical contact with conductive layer 38. A passivation layer 44 is formed over passivation layer 40 and conductive layer 42 for structural support and electrical isolation. A portion of passivation layer 44 is removed using a mask-defined etching process to expose conductive layer 42. UBM 46 is deposited over passivation layer 44 and conductive layer 42.

The combination of passivation layer 36, conductive layer 38, passivation layer 40, conductive layer 42, and passivation layer 44 constitute a wafer level redistribution layer (WL RDL) or interconnect structure 63. WL RDL 63 is implemented through an interconnect circuit build-up process to provide electrical connection between semiconductor die 50 and 54, as well as electrical connection to solder bumps 66.

Contact pads 56 of semiconductor die 50 and 54 are electrically connected to UBMs 46 by thermal bonding or flip-chip interconnect. An encapsulant or molding compound 58 is formed over semiconductor die 50 and 54 and the underlying WL RDL interconnect structure 63.

The dummy substrate 30 is removed by mechanical back grinding, chemical wet etching, plasma dry etching, or chemical mechanical polishing. Passivation layer 36 is patterned and etched to expose conductive layer 38. UBM 64 is formed in electrical contact with conductive layer 38. An electrically conductive solder material is deposited over UBMs 64 using an electrolytic plating or electroless plating process. The solder material is reflowed by heating the conductive material above its melting point to form spherical balls or bumps 66. In some applications, solder bumps 66 are reflowed a second time to improve electrical contact to the UBM structure.

Figure 4:
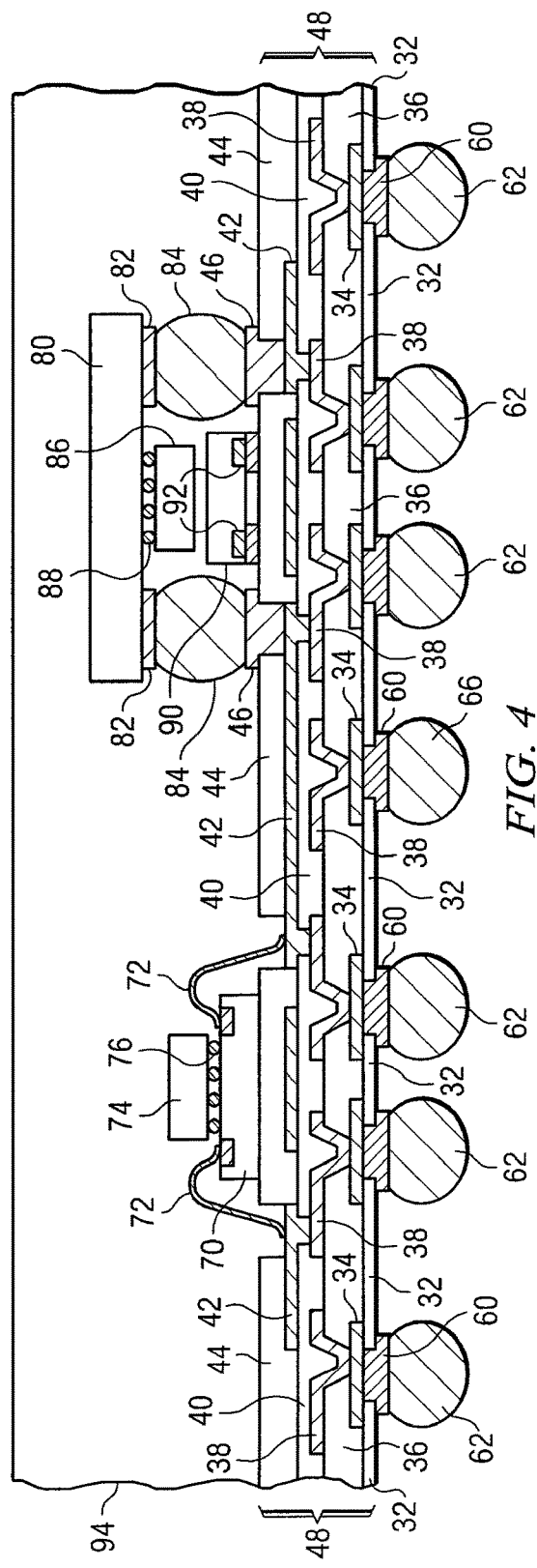
FIG. 4 illustrates the interconnect structure for the semiconductor die using solder bumps and bond wires.

Another wafer level interconnect structure is shown in FIG. 4. The dummy substrate 30 and WL RDL 48 are formed as described in FIG. 2a. After formation of WL RDL 48, the contact pads of semiconductor die 70 are electrically connected to conductive layer 42 by bond wires 72. Flip chip semiconductor package 74 is electrically connected to semiconductor die 70 with solder bumps 76. The contact pads of semiconductor die 80 are electrically connected to conductive layer 42 through UBMs 82, solder bumps 84, and UBMs 46. Flip chip semiconductor package 86 is electrically connected to semiconductor die 80 with solder bumps 88. The contact pads 92 of semiconductor die 90 are electrically connected to conductive layer 42. Semiconductor die 90 can be an IC or passive device surface mounted to WL RDL 48.

An encapsulant or molding compound 94 is formed over semiconductor die 70, 74, 80, 86, and 90 and the underlying WL RDL interconnect structure 48. Encapsulant 94 can be made with epoxy or polymer material. The dummy substrate 30 is removed by mechanical back grinding, chemical wet etching, plasma dry etching, or chemical mechanical polishing. Passivation layer 32 is patterned and etched to expose conductive layer 34. UBMs 60 are formed in electrical contact with conductive layer 34 and conductive layer 38. An electrically conductive solder material is deposited over UBMs 60 using an electrolytic plating or electroless plating process. The solder material is reflowed by heating the conductive material above its melting point to form spherical balls or bumps 62.

Figure 5:
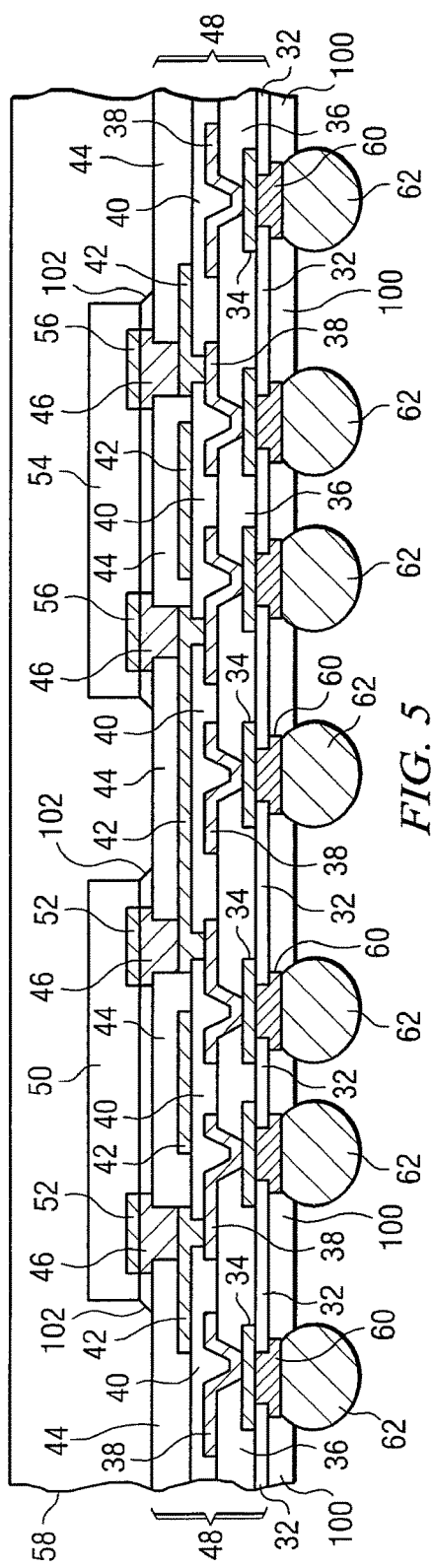
FIG. 5 illustrates the interconnect structure with underfill under semiconductor die and second passivation around the backside solder bumps.

In FIG. 5, dummy substrate 30 and WL RDL 48 are formed as described in FIG. 2a. Semiconductor die 50 and 54 are mounted to WL RDL 48, as described in FIG. 2b. An underfill material 102 is disposed under semiconductor die 50 and 54. The underfill material 102 can be made with epoxy, polymeric material, film, or other non-conductive material. An encapsulant or molding compound 58 is formed over semiconductor die 50 and 54 and the underlying WL RDL interconnect structure 48. The dummy substrate 30 is removed by mechanical back grinding, chemical wet etching, plasma dry etching, or chemical mechanical polishing. Passivation layer 32 is patterned and etched to expose conductive layer 34. UBMs 60 are formed in electrical contact with conductive layer 34 and conductive layer 38. An electrically conductive solder material is deposited over UBMs 60 using an electrolytic plating or electroless plating process. A passivation layer 100 is formed over passivation layer 32 for structural support and electrical isolation. Passivation layer 100 can have one or more layers of Si3N4, SiO2, SiON, PI, BCB, PBO, WPR, epoxy, or other insulating material. A portion of passivation layer 100 is removed using a mask-defined etching process to expose UBMs 60. The solder material is reflowed by heating the conductive material above its melting point to form spherical balls or bumps 62.

Figure 6:
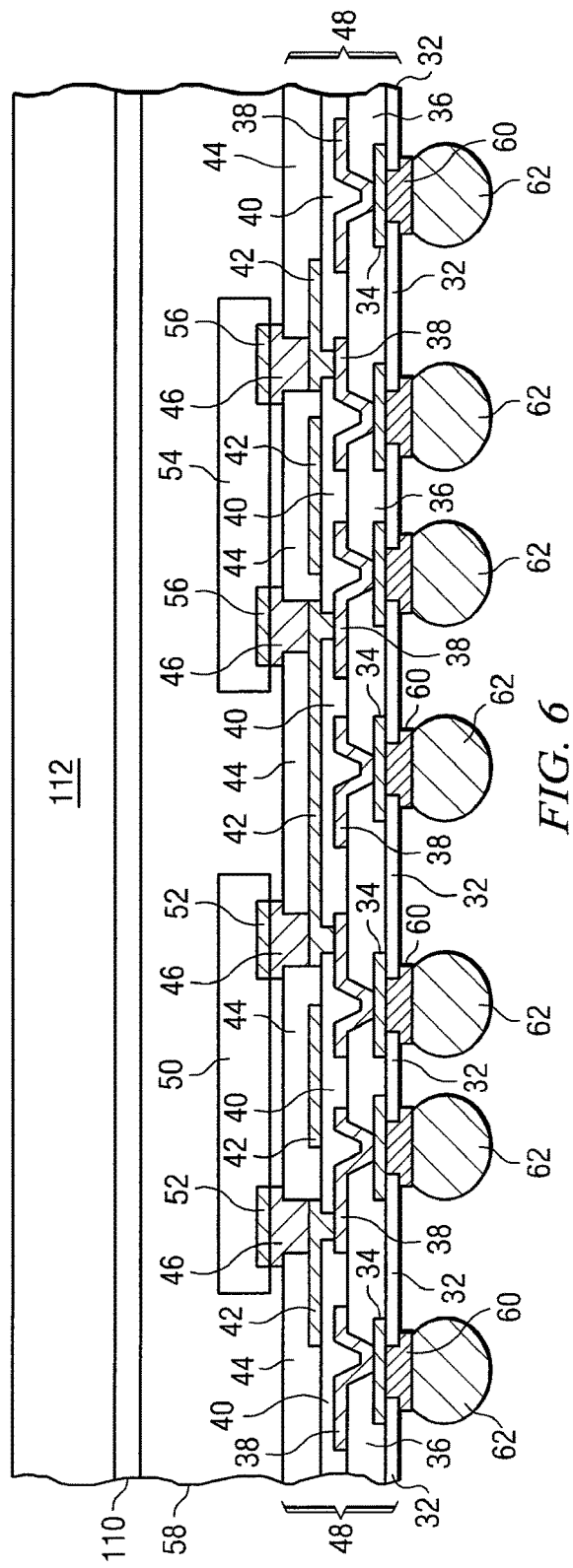
FIG. 6 illustrates the interconnect structure for the semiconductor die with adhesive and carrier over encapsulant.

In FIG. 6, dummy substrate 30 and WL RDL 48 are formed as described in FIG. 2a. Semiconductor die 50 and 54 are mounted to WL RDL 48, as described in FIG. 2b. An encapsulant or molding compound 58 is formed over semiconductor die 50 and 54 and the underlying WL RDL interconnect structure 48. An adhesive layer 110 is applied to a top surface of encapsulant 58. A chip carrier 112 is bonded to the encapsulant with adhesive 110. Chip carrier 112 can be metal, laminate substrate, glass, or polymer with filler. The chip carrier can be pre-formed and then laminated or bonded to encapsulant 58. The chip carrier can also be formed in-situ, for example as a second molding compound or encapsulant. The adhesive and chip carrier can be temporary or permanent. The backside of semiconductor die 50 and 54 can be exposed after molding, or thermally connected to carrier 112 for heat dissipation.

The dummy substrate 30 is removed by mechanical back grinding, chemical wet etching, plasma dry etching, or chemical mechanical polishing. Passivation layer 32 is patterned and etched to expose conductive layer 34. UBM 60 is formed in electrical contact with conductive layer 34 and conductive layer 38. An electrically conductive solder material is deposited over UBMs 60 using an electrolytic plating or electroless plating process. The solder material is reflowed by heating the conductive material above its melting point to form spherical ball or bump 62.

Figure 7:
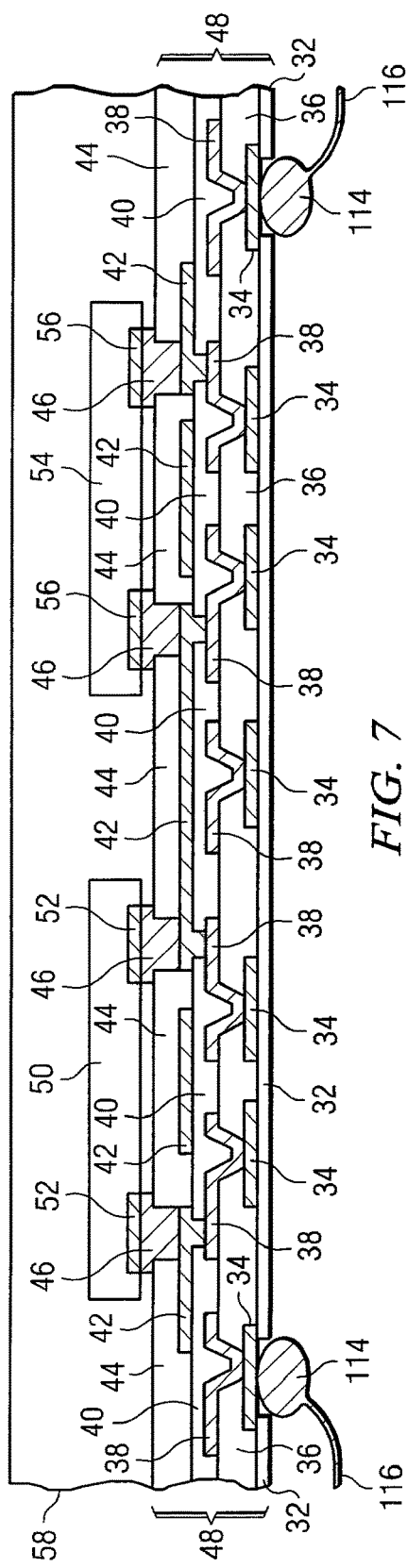
FIG. 7 illustrates the interconnect structure for the semiconductor die with bond wires.

In FIG. 7, dummy substrate 30 and WL RDL 48 are formed as described in FIG. 2a. Semiconductor die 50 and 54 are mounted to WL RDL 48, as described in FIG. 2b. An encapsulant or molding compound 58 is formed over semiconductor die 50 and 54 and the underlying WL RDL interconnect structure 48. The dummy substrate 30 is removed by mechanical back grinding, chemical wet etching, plasma dry etching, or chemical mechanical polishing. Passivation layer 32 is patterned and etched to expose conductive layer 34. Bond wires 116 are electrically connected to conductive layer 34 using wire bond 114.

Figure 8:
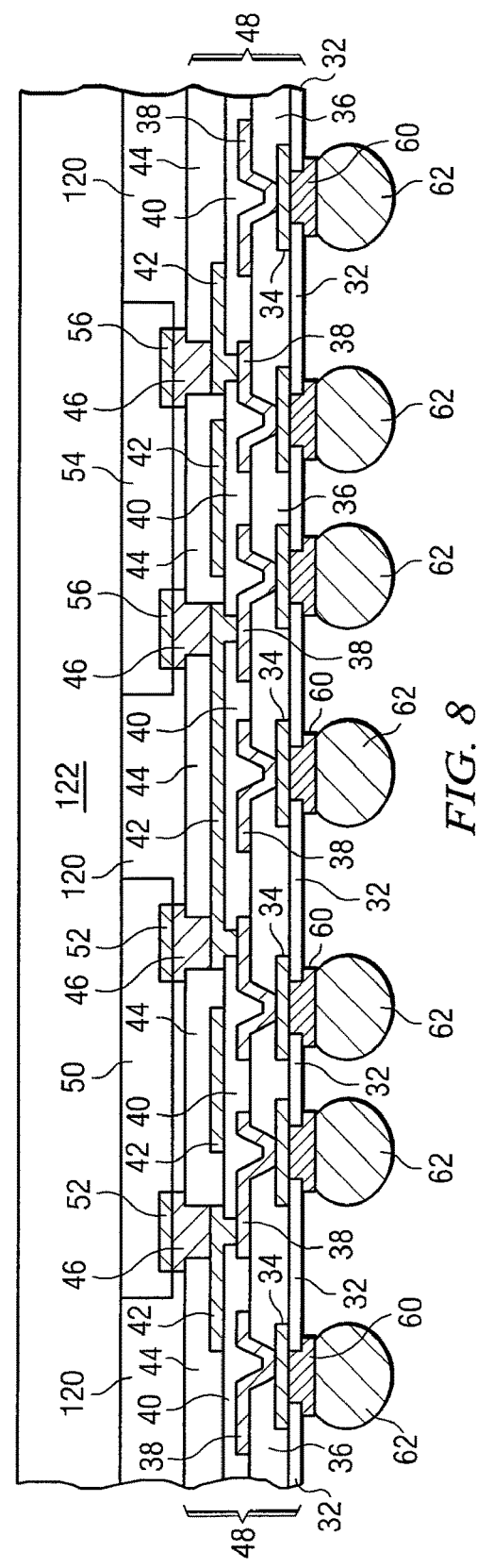
FIG. 8 illustrates the interconnect structure for the semiconductor die with first and second encapsulants.

In FIG. 8, dummy substrate 30 and WL RDL 48 are formed as described in FIG. 2a. Semiconductor die 50 and 54 are mounted to WL RDL 48, as described in FIG. 2b. A first encapsulant or molding compound 120 is formed over semiconductor die 50 and 54 and the underlying WL RDL interconnect structure. Encapsulant 120 underfills semiconductor die 50 and 54. A second encapsulant or molding compound 122 is formed over encapsulant 120. Encapsulants 120 and 122 can be made with epoxy or polymer material. Encapsulant 122 supports the semiconductor package and provides good thermal conductivity. Encapsulants 120 and 122 post-cure at the same time.

The dummy substrate 30 is removed by mechanical back grinding, chemical wet etching, plasma dry etching, or chemical mechanical polishing. Passivation layer 32 is patterned and etched to expose conductive layer 34. UBM 60 is formed in electrical contact with conductive layer 34 and conductive layer 38. An electrically conductive solder material is deposited over UBMs 60 using an electrolytic plating or electroless plating process. The solder material is reflowed by heating the conductive material above its melting point to form spherical ball or bump 62.

In summary, the WL RDL interconnect structure is formed on the dummy substrate prior to mounting semiconductor die. Once the semiconductor die are mounted and encapsulated, the dummy substrate is removed so external interconnects such as UBMs 60 and solder bumps 62 can be formed. By forming the WL RDL on a dummy substrate prior to mounting the semiconductor die, the processing temperature restriction due to the WL RDL process noted in the background can be reduced. In other words, since there is no substrate with Tg less than 200° C. used in the process, higher temperatures in excess of 200° C. can be used to form the WL RDL interconnect structure.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a wafer level chip scale package, comprising the steps (a)-(j) in sequence:
 (a) providing a temporary wafer level substrate;
 (b) forming a wafer level interconnect structure over the temporary wafer level substrate using wafer level processes including at a temperature greater than or equal to 200° C. by,
  (i) forming a first insulating layer over a surface of the temporary wafer level substrate, wherein a first surface of the first insulating layer is in direct contact with the surface of the temporary wafer level substrate, and
  (ii) forming a first conductive layer in direct contact with a second surface of the first insulating layer opposite the first surface of the first insulating layer after forming the first insulating layer;
 (c) disposing a plurality of first semiconductor die over the wafer level interconnect structure;
 (d) depositing an underfill material between the first semiconductor die and the wafer level interconnect structure;
 (e) depositing a first encapsulant over an entire surface of the wafer level interconnect structure and around the plurality of first semiconductor die;
 (f) removing the temporary wafer level substrate while retaining the entire first insulating layer;
 (g) forming a plurality of openings through the first insulating layer and exposing a portion of the first conductive layer;

(h) forming an under bump metallization (UBM) layer in the openings to contact the first conductive layer;
(i) forming a second insulating layer in contact with the first surface of the first insulating layer; and
(j) forming a plurality of bumps on the UBM layer,
wherein forming the wafer level interconnect structure further includes forming a third insulating layer over the first conductive layer and the first insulating layer; forming a second conductive layer over the first conductive layer and the third insulating layer; forming a fourth insulating layer over the second conductive layer and the third insulating layer; forming a third conductive layer over the second conductive layer and the fourth insulating layer; and forming a fifth insulating layer over the third conductive layer and the fourth insulating layer; removing a portion of the fifth insulating layer to expose apportion of the third conductive layer and depositing a metal layer in the removed portion of the fifth insulating layer.

2. A method of making a wafer level chip scale package, comprising the steps (a)-(j) in sequence:
(a) providing a temporary wafer level substrate;
(b) forming a wafer level interconnect structure over the temporary wafer level substrate using wafer level processes including at a temperature greater than or equal to 200° C. by,
 (i) forming a first insulating layer over a surface of the temporary wafer level substrate, wherein a first surface of the first insulating layer is in direct contact with the surface of the temporary wafer level substrate, and
 (ii) forming a first conductive layer in direct contact with a second surface of the first insulating layer opposite the first surface of the first insulating layer after forming the first insulating layer;
(c) disposing a plurality of first semiconductor die over the wafer level interconnect structure;
(d) depositing an underfill material between the first semiconductor die and the wafer level interconnect structure;
(e) depositing a first encapsulant over an entire surface of the wafer level interconnect structure and around the plurality of first semiconductor die;
(f) removing the temporary wafer level substrate while retaining the entire first insulating layer;
(g) forming a plurality of openings through the first insulating layer and exposing a portion of the first conductive layer;
(h) forming a second conductive layer in the openings over the first conductive layer;
(i) forming a plurality of bumps over the second conductive layer; and
(j) forming a second insulating layer in contact with the first surface of the first insulating layer after removing the temporary wafer level substrate;
wherein forming the wafer level interconnect structure further includes forming a third insulating layer over the first conductive layer and the first insulating layer; forming a second conductive layer over the first conductive layer and the third insulating layer; forming a fourth insulating layer over the second conductive layer and the third insulating layer; forming a third conductive layer over the second conductive layer and the fourth insulating layer; and forming a fifth insulating layer over the third conductive layer and the fourth insulating layer; removing a portion of the fifth insulating layer to expose apportion of the third conductive layer and depositing a metal layer in the removed portion of the fifth insulating layer.

3. A method of making a wafer level chip scale package, comprising the steps (a)-(j) in sequence:
providing a temporary wafer level substrate;
forming a wafer level interconnect structure over the temporary wafer level substrate using wafer level processes including,
(a) forming a first insulating layer over a surface of the temporary wafer level substrate, wherein a first surface of the first insulating layer is in direct contact with the surface of the temporary wafer level substrate, and
(b) forming a first conductive layer over a second surface of the first insulating layer opposite the first surface of the first insulating layer after forming the first insulating layer;
(c) disposing a plurality of first semiconductor die over the wafer level interconnect structure to form a wafer;
(d) disposing a second semiconductor die over the plurality of the first semiconductor die;
(e) disposing a third semiconductor die over a first surface of one of the second semiconductor die, wherein the second semiconductor die is interposed between the first semiconductor die and the third semiconductor die;
(f) depositing an encapsulant over the wafer level interconnect structure and over and around the plurality of first semiconductor die, the second semiconductor die and the third semiconductor die;
(g) removing the temporary wafer level substrate while retaining the first insulating layer;
(h) forming a plurality of openings through the first insulating layer and exposing a portion of the first conductive layer after removing the temporary wafer level substrate;
(i) forming a second conductive layer in the openings over the first conductive layer and forming a plurality of bumps over the second conductive layer; and
(j) singulating the wafer into a semiconductor chip scale package.

4. The method of claim 3, further including forming a portion of the wafer level interconnect structure at a temperature greater than or equal to 200 degrees C.

5. A method of making a wafer level chip scale package, comprising the steps (a)-(j) in sequence:
(a) providing a temporary wafer level substrate;
(b) forming a wafer level interconnect structure over the temporary wafer level substrate using wafer level processes including,
 (i) forming a first insulating layer over a surface of the temporary wafer level substrate, wherein the first insulating layer cover an entire portion of the surface of the temporary wafer level substrate, and
 (ii) forming a first conductive layer over a second surface of the first insulating layer opposite the first surface of the first insulating layer after forming the first insulating layer;
(c) disposing a plurality of first semiconductor die over the wafer level interconnect structure to form a wafer;
(d) disposing a second semiconductor die over the plurality of the first semiconductor die;
(e) disposing a third semiconductor die over a first surface of one of the second semiconductor die, wherein the second semiconductor die is interposed between the first semiconductor die and the third semiconductor die;
(f) depositing an encapsulant over the wafer level interconnect structure and over and around the plurality of first semiconductor die, the second semiconductor die and the third semiconductor die;

(g) removing the temporary wafer level substrate while retaining the first insulating layer;

(h) forming a plurality of openings through the first insulating layer and exposing a portion of the first conductive layer after removing the temporary wafer level substrate;

(i) forming a second conductive layer in the openings over the first conductive layer and forming a plurality of bumps over the second conductive layer; and (j) singulating the wafer into a semiconductor chip scale package.

6. The method of claim 5, further including forming a portion of the wafer level interconnect structure at a temperature greater than or equal to 200 degrees C.

* * * * *